US012751303B2

(12) United States Patent
Kim et al.

(10) Patent No.: US 12,751,303 B2
(45) Date of Patent: Sep. 29, 2026

(54) METHOD OF MANUFACTURING PACKAGING SUBSTRATE AND PACKAGING SUBSTRATE MANUFACTURED THEREBY

(71) Applicant: Absolics Inc., Covington, GA (US)

(72) Inventors: Tae Kyoung Kim, Covington, GA (US); Si Hun Lee, Hwaseong-si (KR)

(73) Assignee: Absolics Inc., Covington, GA (US)

( * ) Notice: Subject to any disclaimer, the term of this patent is extended or adjusted under 35 U.S.C. 154(b) by 398 days.

(21) Appl. No.: 18/458,160

(22) Filed: Aug. 30, 2023

(65) Prior Publication Data

US 2025/0079324 A1 Mar. 6, 2025

(51) Int. Cl.
*H10W 70/65* (2026.01)
*H10W 70/05* (2026.01)
(Continued)

(52) U.S. Cl.
CPC ........... *H10W 70/65* (2026.01); *H10W 70/05* (2026.01); *H10W 70/611* (2026.01);
(Continued)

(58) Field of Classification Search
CPC . H01L 23/5386; H01L 21/4857; H01L 21/56; H01L 23/15; H01L 23/3121; H01L 23/5383; H01L 23/5384; H01L 24/16; H01L 25/105; H01L 2224/16145; H01L 2224/16225; H01L 23/5385;
(Continued)

(56) References Cited

U.S. PATENT DOCUMENTS 6,787,895 B1 * 9/2004 Jarcy .................. H01L 23/3121 361/764
8,411,459 B2 * 4/2013 Yu .......................... H01L 23/15 361/783

(Continued)

FOREIGN PATENT DOCUMENTS

JP 2002246722 8/2002
JP 4248157 4/2009

(Continued)

*Primary Examiner* — Vu A Vu
(74) *Attorney, Agent, or Firm* — JCIP GLOBAL INC.

(57) ABSTRACT

The present disclosure relates to a method of manufacturing a packaging substrate and a packaging substrate manufactured thereby. The method of manufacturing a packaging substrate according to the present disclosure includes: generating a glass structure that is a core via, a cavity portion, or both on a glass core including a first surface and a second surface facing each other; forming an insulating layer on the first surface or second surface using an insulating film; and forming an upper layer including an upper distribution layer and an upper surface connection layer on the insulating layer. The forming of the insulating layer May include a primary curing operation of laminating a first insulating film on the first surface and primarily curing the first insulating film, and a secondary curing operation of laminating a second insulating film on the primarily cured first insulating film and secondarily curing the second insulating film. Accordingly, warpage may be improved, and separation of an electronic element may be prevented.

13 Claims, 11 Drawing Sheets

(51) Int. Cl.

| | |
|---|---|
| ***H10W 70/60*** | (2026.01) |
| ***H10W 70/63*** | (2026.01) |
| ***H10W 70/685*** | (2026.01) |
| ***H10W 70/692*** | (2026.01) |
| ***H10W 74/01*** | (2026.01) |
| ***H10W 74/10*** | (2026.01) |
| *H10W 90/00* | (2026.01) |

(52) U.S. Cl.

CPC ....... *H10W 70/635* (2026.01); *H10W 70/685* (2026.01); *H10W 70/692* (2026.01); *H10W 74/01* (2026.01); *H10W 74/114* (2026.01); *H10W 90/00* (2026.01); *H10W 90/722* (2026.01); *H10W 90/724* (2026.01)

(58) Field of Classification Search

CPC ........... H01L 23/49822; H01L 2224/18; H01L 2924/15153; H01L 23/5389; H01L 21/4803; H01L 23/3157; H01L 23/13; H01L 21/477; H01L 23/142; H01L 23/315; H01L 23/49838; H01L 2924/3511

USPC .......................................................... 257/668

See application file for complete search history.

(56) References Cited

U.S. PATENT DOCUMENTS

| | | | | |
|---|---|---|---|---|
| 8,829,672 | B2 * | 9/2014 | Chen | H01L 24/96 257/737 |
| 9,155,191 | B2 * | 10/2015 | Kim | H05K 1/0271 |
| 9,322,901 | B2 * | 4/2016 | Kerness | G01S 17/04 |
| 11,058,009 | B2 * | 7/2021 | Mok | H05K 3/0026 |
| 11,270,920 | B2 * | 3/2022 | Kim | H01L 24/14 |
| 11,810,844 | B2 * | 11/2023 | Mok | H01L 23/13 |
| 2010/0276829 | A1 * | 11/2010 | Yang | B29C 39/003 264/114 |
| 2013/0333930 | A1 | 12/2013 | Koyanagi | |
| 2014/0070405 | A1 * | 3/2014 | Agarwal | H01L 23/15 257/737 |
| 2014/0360760 | A1 | 12/2014 | Kiwanami et al. | |
| 2020/0058567 | A1 | 2/2020 | Kim et al. | |
| 2021/0183783 | A1 | 6/2021 | Park et al. | |
| 2021/0287977 | A1 | 9/2021 | Mok | |
| 2022/0007511 | A1 | 1/2022 | Jeong et al. | |
| 2022/0051972 | A1 * | 2/2022 | Kim | H01L 23/49822 |
| 2022/0293560 | A1 | 9/2022 | Chen et al. | |
| 2023/0148220 | A1 | 5/2023 | Verhaverbeke et al. | |
| 2024/0332104 | A1 * | 10/2024 | Lee | H01L 21/568 |
| 2024/0332195 | A1 * | 10/2024 | Soetan-Dodd | H01L 23/5385 |

FOREIGN PATENT DOCUMENTS

| | | |
|---|---|---|
| JP | 2015038962 | 2/2015 |
| JP | 2023103353 | 7/2023 |
| JP | 2023536041 | 8/2023 |
| KR | 20200058129 | 5/2020 |
| KR | 1020200058129 | 5/2020 |
| KR | 102163041 | 10/2020 |
| KR | 102333084 | 12/2021 |
| KR | 20220005236 | 1/2022 |
| WO | 2011074283 | 6/2011 |
| WO | 2019073801 | 4/2019 |

* cited by examiner

METHOD OF MANUFACTURING PACKAGING SUBSTRATE AND PACKAGING SUBSTRATE MANUFACTURED THEREBY

BACKGROUND

1. Field of the Invention

The embodiments relate to a method of manufacturing a semiconductor packaging substrate, and more particularly, to a method of manufacturing a packaging substrate including a glass core and an insulating layer, and a packaging substrate manufactured thereby.

2. Discussion of Related Art

In manufacturing electronic components, implementing a circuit on a semiconductor wafer is called a front-end (FE) process, assembling the wafer in a state of being usable in an actual product is called a back-end (BE) process, and a packaging process is included in a subsequent process.

The four core technologies of the semiconductor industry, which recently enabled rapid development of electronic products, include semiconductor technology, semiconductor packaging technology, manufacturing process technology, and software technology. Semiconductor technology has developed in various forms, such as nanoscale (submicron) line widths, 10 million cells or more, high-speed operation, large amount heat dissipation, and the like, but a relatively perfect packaging technology is not supported. Accordingly, the electrical performance of a semiconductor can sometimes be determined by the packaging technology and the electrical connection according to the packaging technology rather than performance of the semiconductor technology itself.

Although a ceramic or resin has been applied as a material of a packaging substrate, recently, research on applying silicon or glass for a high-end packaging substrate is in progress, and specifically, a packaging substrate having a cavity structure has been developed by applying a glass core.

Further, in the most widely used packaging substrate, for example, in a flip chip-ball grid array (FC-BGA), an Ajinomoto Build-up Film (ABF), which serves as an insulator and an adhesive, is used.

Meanwhile, in the packaging process, a re-distribution layer (RDL) refers to the technology that collectively refers to the technology that changes the position of a previously formed electrical terminal (for example: an A1 pad) to an arbitrary position using wafer level package (WLP) process technology. This RDL is used as a method of solving design limitations in semiconductor manufacturing processes through packages, that is, is used in semiconductor chip stacks.

RELATED ART DOCUMENTS

Patent Documents

US Patent Laid-Open Application US20220293560A1

Korean Patent Application No. 10-2018-0142742

SUMMARY OF THE INVENTION

An embodiment is directed to providing a packaging substrate manufacturing method capable of improving a warpage phenomenon which may occur due to a difference in thermal expansion degree, stress generated therefrom, and the like in a packaging substrate in which a glass core and an insulating film are used, and a packaging substrate manufactured thereby.

Further, an embodiment is directed to providing a packaging substrate manufacturing method capable of preventing the separation or departure of electronic elements disposed in a cavity portion of a glass core, and a packaging substrate manufactured thereby.

In order to achieve the above object, a method of manufacturing a packaging substrate according to one embodiment includes: generating a glass structure that is a core via, a cavity portion, or both on a glass core including a first surface and a second surface facing each other;

forming an insulating layer on the first surface or the second surface using an insulating film; and forming an upper layer including an upper distribution layer and an upper surface connection layer on the insulating layer.

The forming of the insulating layer may include a primary curing operation of laminating a first insulating film on the first surface and primarily curing the first insulating film, and a secondary curing operation of laminating a second insulating film on the primarily cured first insulating film and secondarily curing the second insulating film.

The cavity portion may be open and recessed in a direction toward the first surface or the second surface of the glass core or may pass through the first surface and the second surface to have a space where an electronic element is disposed.

The method may further include arranging the electronic element in the cavity portion.

According to one embodiment, the arranging of the electronic element may be included between the generating of the glass structure and the forming of the insulating layer.

According to one embodiment, the first insulating film may be laminated on the entire first surface or the cavity portion where the electronic element is arranged.

According to one embodiment, when the first insulating film is laminated on the cavity portion, the first insulating film may be cut based on a shape and a size of the cavity portion.

According to one embodiment, a thickness of the first insulating film and a thickness of the second insulating film may be different from each other.

According to one embodiment, a pressure sensitive lamination method may be applied to each of the primary curing operation and the secondary curing operation. And a pressure and a temperature applied during the secondary curing operation may be higher than a pressure and a temperature applied during the primary curing operation.

The method may further include: after the secondary curing operation, a final curing operation.

The final curing operation may be an operation on the final curing the first insulating film and the second insulating film.

According to one embodiment, the electronic element may include a passive element or an active element.

Meanwhile, in order to achieve the above object, a packaging substrate according to one embodiment includes a core layer and an upper layer located on the core layer, wherein the core layer includes a glass core including a first surface and a second surface facing each other, a plurality of core vias and a cavity portion passing through the glass core in a thickness direction, an electrically conductive layer formed on a surface of the glass core, an electronic element arranged in the cavity portion, and an insulating layer filling the core vias and the cavity portion, the cavity portion is open and recessed in a direction toward the first surface or the second surface of the glass core or passes through the first surface and the second surface to have a space where the electronic element is disposed, and the insulating layer includes a first insulating layer in which a first insulating film is laminated on the first surface and cured, and a second insulating layer in which a second insulating film is laminated on the first insulating layer and cured.

According to one embodiment, the first insulating layer may be formed on the entire first surface or the cavity portion where the electronic element is arranged.

According to one embodiment, the insulating layer may further include a third insulating layer in which the second insulating film is laminated in a direction from the second surface to the first surface and cured.

According to one embodiment, a first boundary where the first insulating film and the second insulating film come into contact may be formed between the first insulating layer and the second insulating layer; and a second boundary where the first insulating film and the second insulating film come into contact may be formed between the second insulating layer and the third insulating layer.

The second boundary may be formed in the core vias and the cavity portion.

According to one embodiment, a color of the first insulating layer and a color of the third insulating layer may be different from each other.

According to one embodiment, a thickness of the first insulating layer and a thickness of the third insulating layer may be different from each other.

According to one embodiment, the glass core may be a quadrangular shaped glass plate.

According to one embodiment, a thickness of the glass core may be 300 μm to 1,500 μm.

According to one embodiment, an average of heights in which edges of the packaging substrate are spaced apart from a floor on which the packaging substrate is laid may be 12 mm or less.

The electronic element may comprise an active element or a passive element.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION OF EXEMPLARY EMBODIMENTS

Figure 1:
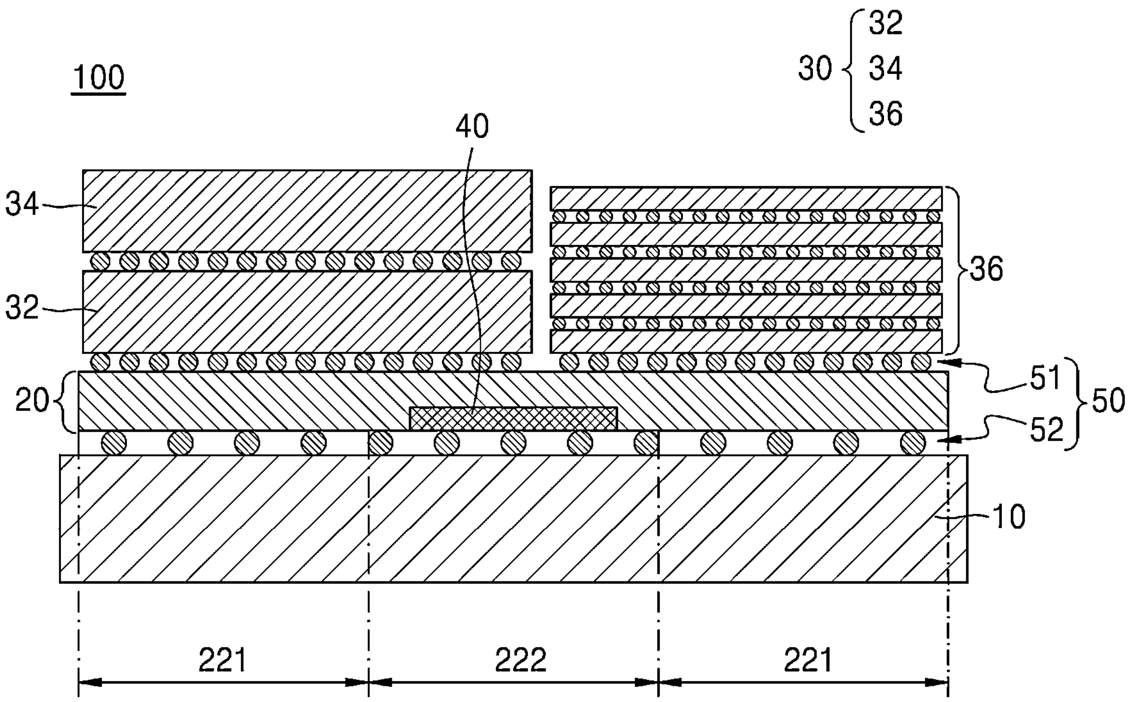
FIG. 1 is a conceptual diagram for describing a cross-sectional structure of a packaging substrate according to an embodiment.

Hereinafter, embodiments will be described in detail with reference to the accompanying drawings, which may allow those skilled in the art to easily perform the present disclosure. The embodiments may be implemented in various forms and are not limited to embodiments described herein. Like reference numbers are used for like components throughout the specification.

Throughout the present specification, the term "combination thereof" included in expression of the Markush form refers to a mixture or combination of one or more selected from a group consisting of components disclosed in the expression of the Markush form, and refers to including one or more selected from the group consisting of the components.

Throughout the present specification, terms such as "first, " "second" or "A," "B" are used to distinguish the same terms. Further, a singular form includes a plural form unless otherwise defined in the context.

In the present specification, "~-based" may refer to including a compound corresponding to "~" or a derivative of the "~" in the compound.

In the present specification, the expression B is located on A means that B is directly located on A or B is located on A while another layer is located therebetween, and is not interpreted as being limited to B being located on A while in contact therewith.

In the present specification, the expression B is connected to A means that B is directly connected to A or B is connected to A through another component therebetween, and is not interpreted as being limited to B being directly connected to A unless otherwise specifically mentioned.

In the present specification, a singular form is interpreted as a meaning including a singular form or plural form unless otherwise specifically described.

In a process of developing a semiconductor device capable of exhibiting high performance while being relatively more integrated and having a thinner thickness, while recognizing that not only an element itself but also packaging is an important factor in performance improvement and researching this, the present inventors found that a packaging substrate may become relatively thinner and become helpful for improving the electrical characteristics of the semiconductor device by a method of applying a glass core as a single layer, applying a cavity structure, and the like unlike applying a core of two layers or more, such as a conventional interposer and an organic substrate, on a motherboard as a packaging substrate, and completed the invention.

A process of forming a re-distribution layer (RDL) involves a curing process of an insulating layer, such as an Ajinomoto Build-up Film (ABF), and in this process, the warpage of the packaging substrate occurred. The present inventors determined that this phenomenon was caused by the fact that the degree of thermal expansion (coefficient of thermal expansion) of inner components constituting the substrate and the ABF was different, stress due to heat was generated, and the like, and recognized the necessity of improving the warpage phenomenon.

Accordingly, as a result of repeated research, when the insulating layer is generated in a core via and a cavity structure, as pre-curing of an insulating film is performed not once but several times, the present invention was completed by identifying that warpage in which a glass core is bent due to a difference in coefficient of thermal expansion (CTE) between the insulating film and the glass core etc., can be improved.

Figure 2:
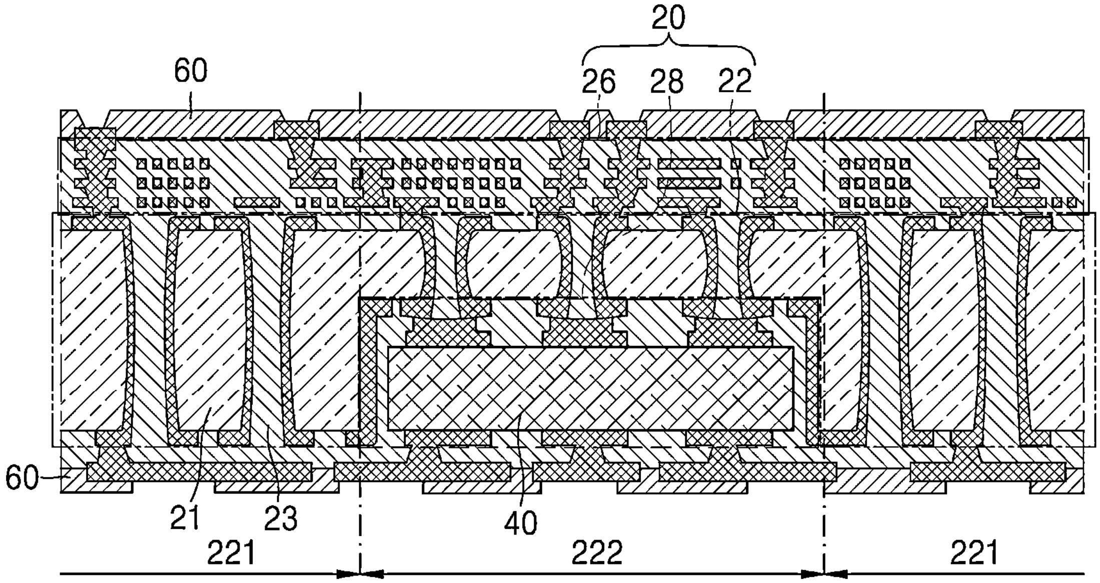
FIG. 2 is a conceptual diagram for describing a cross-sectional structure of a packaging substrate according to another embodiment.
Figure 3A:
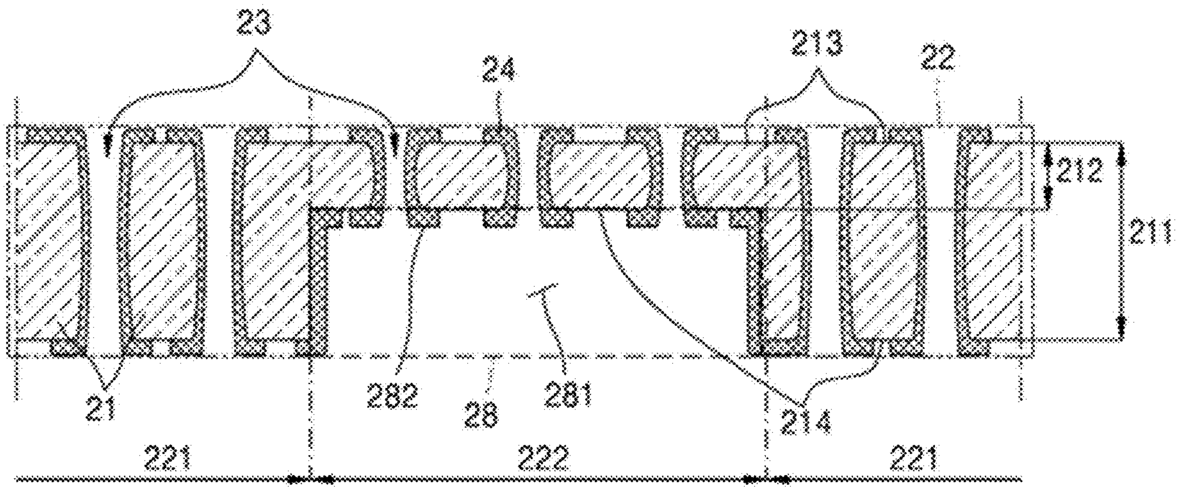
FIGS. 3A and 3B are conceptual diagrams for respectively describing portions of the packaging substrates according to the embodiments in cross-sections.
Figure 3B:
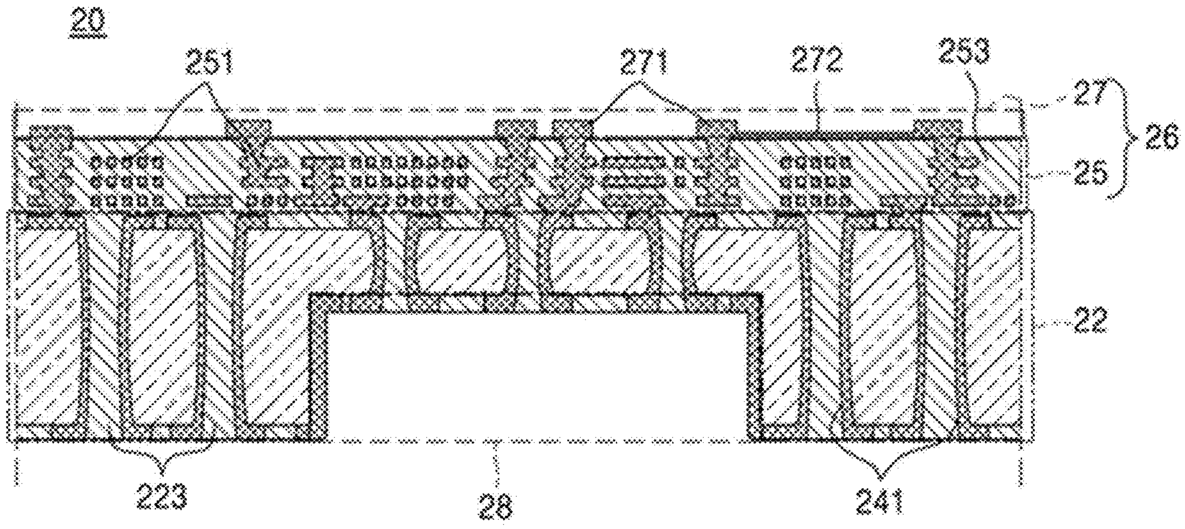

FIG. 1 is a conceptual diagram for describing a cross-sectional structure of a packaging substrate according to an embodiment, FIG. 2 is a conceptual diagram for describing a structure of a packaging substrate according to another embodiment in cross-section, and FIGS. 3A and 3B are conceptual diagrams for respectively describing portions of the packaging substrates according to the embodiments in cross-sections.

In order to achieve the above object, a semiconductor device 100 according to the embodiment comprises a semiconductor element portion 30 where one or more semiconductor elements 32, 34, and 36 are located, a packaging substrate 20 electrically connected to the semiconductor elements, and a motherboard 10 that is electrically connected to the packaging substrate 20, and transmits an external electrical signal to the semiconductor elements 32, 34, and 36 and connects the semiconductor elements 32, 34, and 36 to each other.

The packaging substrate 20 according to one embodiment comprises a core layer 22, an upper layer 26 located on one surface of the core layer 22, and a cavity portion 28 where an electronic element 40 may be located.

The semiconductor element portion 30 refers to elements mounted in the semiconductor device, and is mounted on the packaging substrate 20 by a connection electrode or the like. Specifically, as the semiconductor element portion 30, for example, arithmetic elements (a first element 32 and a second element 34) such as a central processing unit (CPU), a graphics processing unit (GPU), and the like, a storage element (a third element 36) such as a memory chip, and the like may be applied, but any semiconductor element mounted in a semiconductor device may be applied without limitation.

A motherboard such as a printed circuit board, a printed wiring board, or the like may be applied as the motherboard 10.

The packaging substrate 20 may selectively further include a lower layer (not shown) located under the core layer.

The core layer 22 may comprise a glass core 21 comprising first regions 221 each having a first thickness 211 and a second region 222 adjacent to the first region 221 and having a second thickness 212 thinner than the first thickness, a plurality of core vias 23 passing through the glass core 21 in a thickness direction, and a core distribution layer 24 that is located on a surface of the glass core 21 or surfaces of the core vias 23 and electrically connects a first surface 213 of the glass core 21 and a second surface 214 facing the first surface 213 through the core vias 23. That is, the core layer 22 may refer to a glass structure, which is the glass core 21 comprising the first surface 213 and the second surface 214 facing each other, the core vias 23, and the cavity portion 28, or all of these.

The second region 222 of the core layer 22 may serve as a cavity structure.

In the same region, the glass core 21 has the first surface 213 and the second surface 214 facing each other, and these two surfaces are generally parallel to each other and have uniform thicknesses throughout the glass core 21.

An inner space 281 formed by a thickness difference between the first region 221 and the second region 222 serves to accommodate part or all of the electronic element 40.

The glass core 21 may comprise the core vias 23 passing through the first surface 213 and the second surface 214. The core vias 23 may be formed in both the first region 221 and the second region 222, and may be formed with an intended pitch and pattern.

Conventionally, a form in which a silicon substrate and an organic substrate are stacked was applied as a packaging substrate for a semiconductor device. In the case of silicon substrates, there is a concern that parasitic elements are generated when applied to a high-speed circuit due to the nature of semiconductors, and a disadvantage in that power loss is relatively large. Further, in the case of organic substrates, a large area is required to form a more complicated distribution pattern, but this does not conform to the trend of manufacturing miniaturized electronic devices. In order to form a complex distribution pattern within a predetermined size, pattern miniaturization is substantially required, but there is a practical limit to pattern miniaturization due to the nature of materials such as polymers and the like applied to organic substrates.

In the embodiment, as a method of solving such problems, the glass core 21 is applied as a support of the core layer 22. Further, a packaging substrate 20 having a relatively shortened electrical flow, a relatively compact size, a faster response, and less loss characteristics is provided by applying the core vias 23 formed to pass through the glass core 21 along with the glass core 21.

As the glass core 21, a glass plate applied to a semiconductor may be applied, and for example, a borosilicate glass plate, an alkali-free glass plate, or the like may be applied, but the present disclosure is not limited thereto.

The core vias 23 passes through the glass core 21. The core vias 23 may be formed by removing predetermined regions of the glass core 21, and specifically, may be formed by physically and/or chemically etching plate-shaped glass.

Specifically, the formation of the core vias 23 may be performed by chemically etching or laser etching, or the like after forming defects (flaws) on the surface of the glass core using a method such as a laser, but the present disclosure is not limited thereto.

The number of core vias 23 located in the glass core 21 based on a unit area (1 cm×1 cm) may be 100 to 3000, 100 to 2500, and 225 to 1024. When this pitch condition is satisfied, the formation of an electrically conductive layer and the like and the performance of the packaging substrate may be improved.

The core distribution layer 24 comprises a core distribution pattern 241 that is an electrically conductive layer electrically connecting the first surface and the second surface of the glass core through through-vias, and a core insulating layer 223 surrounding the core distribution pattern 241. The core layer 22 may be formed with the electrically conductive layer therein through the core vias to serve as an electrical path crossing the glass core 21, and may connect upper and lower portions of the glass core with a relatively short distance to have characteristics of faster electrical signal transmission and low loss. For example, a copper plating layer may be applied as the electrically conductive layer, but the present disclosure is not limited thereto.

The shape of the cavity portion 28 is substantially not limited to a circular shape, a triangular shape, a quadrangular shape, a hexagonal shape, an octagonal shape, a cross shape, and the like.

The shape of the electronic element 40 may generally be a cylindrical shape, a rectangular parallelepiped shape, or a polygonal pillar shape.

The cavity portion 28 may comprise a cavity distribution pattern that is an electrically conductive layer electrically connecting the electronic element 40 and the core distribution layer 24, and an insulating layer surrounding the cavity distribution pattern.

Meanwhile, a cavity portion according to another embodiment may be implemented in the form of passing through the first surface 213 and the second surface 214 of the glass core 21. In this case, the cavity portion may be formed according to the same process as a process of forming the core via 23, and the area and shape passing through the glass core 21 may be different from those of the core via 23.

In this embodiment, after the electronic element 40 is arranged in the cavity portion, an insulating layer may be formed. That is, the insulating layer may also be generated in the cavity portion through a process of generating the above-described core insulating layer 223.

The core distribution pattern 241 may be formed to be electrically connected to the electronic element 40.

The electronic element 40 may comprise an active element such as a transistor or a power transmission element such as a multilayer ceramic capacitor (MLCC), that is, a passive element.

When an element such as a transistor serving to convert an electrical signal between a motherboard and a semiconductor element portion to an appropriate level is applied as the electronic element 40, since the electronic element 40 has a form in which a transistor or the like is applied to the path of the packaging substrate 20, a more efficient and faster semiconductor device 100 may be provided.

Further, a power transmission element such as a multilayer ceramic capacitor (MLCC) plays an important role in the performance of a semiconductor element. Generally, at least 200 or more power transmission elements, which are passive elements, are applied to a semiconductor element, and performance thereof is also affected by the characteristics of an electrically conductive layer around the element in power transmission. In one embodiment, a core via having a non-circular shape rather than a circular shape may be applied to a place where a low-resistance electrically conductive layer is required, such as a power transmission element.

Meanwhile, a passive element, such as a capacitor or the like, may be individually inserted into and applied to the electronic element 40, and an element group comprising a plurality of passive elements in the form of being embedded between insulator layers (electronic element insulating layers) may be formed such that electrodes are exposed, and then inserted into the electronic element. In the case of the latter, the workability of manufacturing the packaging substrate may become smoother, and there is a relative advantage in that the insulating layer is sufficiently and reliably located in a space between complicated elements.

The glass core 21 serves as an intermediate and intermediary, which connects the semiconductor element portion 30 and the motherboard 10 at an upper portion and a lower portion, respectively, and the core vias 23 serve as paths through which the electrical signals thereof are transmitted, and thus smoothly transmit the signals.

The upper layer 26 is located on the first surface 213.

The upper layer 26 comprises an upper distribution layer 25 and an upper surface connection layer 27 located on the upper distribution layer 25, and the uppermost surface of the upper layer 26 may be protected by a cover layer 60 formed with an opening that may come into direct contact with the connection electrode of the semiconductor element portion.

The upper distribution layer 25 comprises an upper insulating layer 253 located on the first surface, and an upper distribution pattern 251 embedded in the upper insulating layer 253 as an electrically conductive layer having a predetermined pattern and to which the core distribution layer 24 is at least partially connected.

Any one which is applied as an insulator layer in a semiconductor element, or a packaging substrate may be applied as the upper insulating layer 253, for example, an epoxy-based resin or the like including a filler may be applied, but the present disclosure is not limited thereto.

The insulator layer may be formed by a method of forming and curing a coating layer and may also be formed by a method of laminating an insulator film formed to be a film in an uncured or semi-cured state on the core layer 22 and curing the insulator film. In this case, when a pressure sensitive lamination method or the like is applied, since the insulator is incorporated into a space in the core via 23, an efficient process is possible.

According to one embodiment, even when multi-layer insulator layers are stacked and applied, it may become difficult to substantially distinguish the insulator layers, and a plurality of insulator layers are collectively called as an upper insulation layer. Further, the same insulating material may be applied to the core insulating layer 223 and the upper insulating layer 253, and in this case, a boundary thereof may not be substantially distinguished. Alternatively, according to another embodiment, the boundary of the insulator layers may be generated by setting the pressure and temperature for curing the multi-layer insulator layers differently.

The upper distribution pattern 251 refers to an electrically conductive layer located in the upper insulating layer 253 in a preset form, and may be formed, for example, using a build-up layer method. Specifically, the upper distribution pattern 251 formed with an electrically conductive layer in a vertical direction or horizontal direction in an intended pattern may be formed by repeating a method of forming an insulator layer, removing unnecessary portions of the insulator layer, forming an electrically conductive layer by a method of copper plating or the like, selectively removing unnecessary portions of the electrical conductive layer, forming the insulator layer again on the electrical conductive layer, removing unnecessary portions again, and then forming the electrically conductive layer by a method of plating or the like.

The upper distribution pattern 251 is located between the core layer 22 and the semiconductor element portion 30, and thus is formed to include a micro pattern in at least a portion thereof so that transmission of the electrical signals with the semiconductor element portion 30 may be smoothly performed and an intended complicated pattern may be sufficiently accommodated. In this case, each of a width and an interval of the micro pattern may be smaller than 4 μm, 3.5 μm or less, 3 μm or less, and 2.5 μm or less, and may be 1 to 2.3 μm (hereinafter, descriptions for the micro pattern are the same).

At least a portion of the upper surface connection layer 27 is electrically connected to the upper distribution pattern 251, and the upper surface connection layer 27 includes an upper surface connection pattern 272 located on the upper insulating layer 253 and an upper surface connection electrode 271, which electrically connects the semiconductor element portion 30 and the upper surface connection pattern 272. The upper surface connection pattern 272 may be located on one surface of the upper insulating layer 253, and may be embedded in the upper insulating layer while at least a portion of the upper surface connection pattern 272 may be exposed on the upper insulating layer. For example, when the upper surface connection pattern is located on one surface of the upper insulating layer, the upper insulating layer may be formed by a method of plating or the like, and a case in which the upper surface connection pattern is embedded in the upper insulating layer while the portion of the upper surface connection pattern is exposed on the upper insulating layer may be a case in which a portion of the insulating layer or electrically conductive layer is removed by a method such as surface polishing, surface etching, or the like after a copper plating layer or the like is formed.

At least a portion of the upper surface connection pattern 272 may comprise a micro pattern like the above-described upper distribution pattern 251. The upper surface connection pattern 272 comprising the micro pattern allows a relatively larger number of elements to be connected even in a small area to make an electrical signal connection between the elements or with the outside smooth, and more integrated packaging is possible.

The upper surface connection electrode 271 may be directly connected to the semiconductor element portion 30 through a terminal or the like, and may also be connected to the semiconductor element portion 30 through an element connection portion 51 such as a solder ball.

The cavity portion 28 is located on and/or under the second region 222 and includes a cavity distribution layer 282 electrically connected to the core distribution pattern 241 and an inner space 281 where the electronic element 40 is located.

Specifically, the thickness of the glass core 21 in the second region 222 is thinner than the thickness of the glass core 21 in the first region 221, and the electronic element 40 may be located in the inner space 281 formed due to the thickness difference. Further, the core vias 23 and the core distribution layers 24 formed on the glass core 21 serve as an electrical connection structure connecting the electronic element 40 and external elements.

Further, as described above, in the second region 222 other than the first region 221, that is, a cavity portion in the form of passing through the first surface 213 and the second surface 214 of the glass core 21 may be generated, and the electronic element 40 may be arranged in the cavity portion.

The packaging substrate 20 is also connected to the motherboard 10. A terminal of the motherboard 10 may be directly connected to the core distribution pattern 241 located on at least a portion of the second surface 214 of the core layer 22, and the motherboard 10 may be electrically connected to the core distribution pattern 241 through a board connection portion 52 such as a solder ball. Further, the core distribution pattern 241, which comes into contact with the motherboard 10, may be connected to the motherboard 10 through a lower layer (not shown) located under the core layer 22.

According to an example, other substantially additional substrates other than the glass core 21 may not be applied to the packaging substrate 20 located between the semiconductor element portion 30 and the motherboard 10.

Conventionally, an interposer and an organic substrate were stacked together and applied between the element and the motherboard while connecting the element and the motherboard because a multi-stage form is applied for two reasons: one is that there is a scale problem in directly bonding a micro pattern of the element to the motherboard, and the other is that a problem of wiring damage due to a difference in thermal expansion coefficient may occur during a bonding process or a process of driving the semiconductor device. In the embodiment, this problem was solved by applying a glass core having a thermal expansion coefficient similar to that of a semiconductor element, and forming a micro pattern having a sufficiently fine scale for mounting the element on the first surface and an upper layer of the glass core.

Hereinafter, a manufacturing method of the packaging substrate according to the embodiment of the present disclosure will be described.

Figure 4:
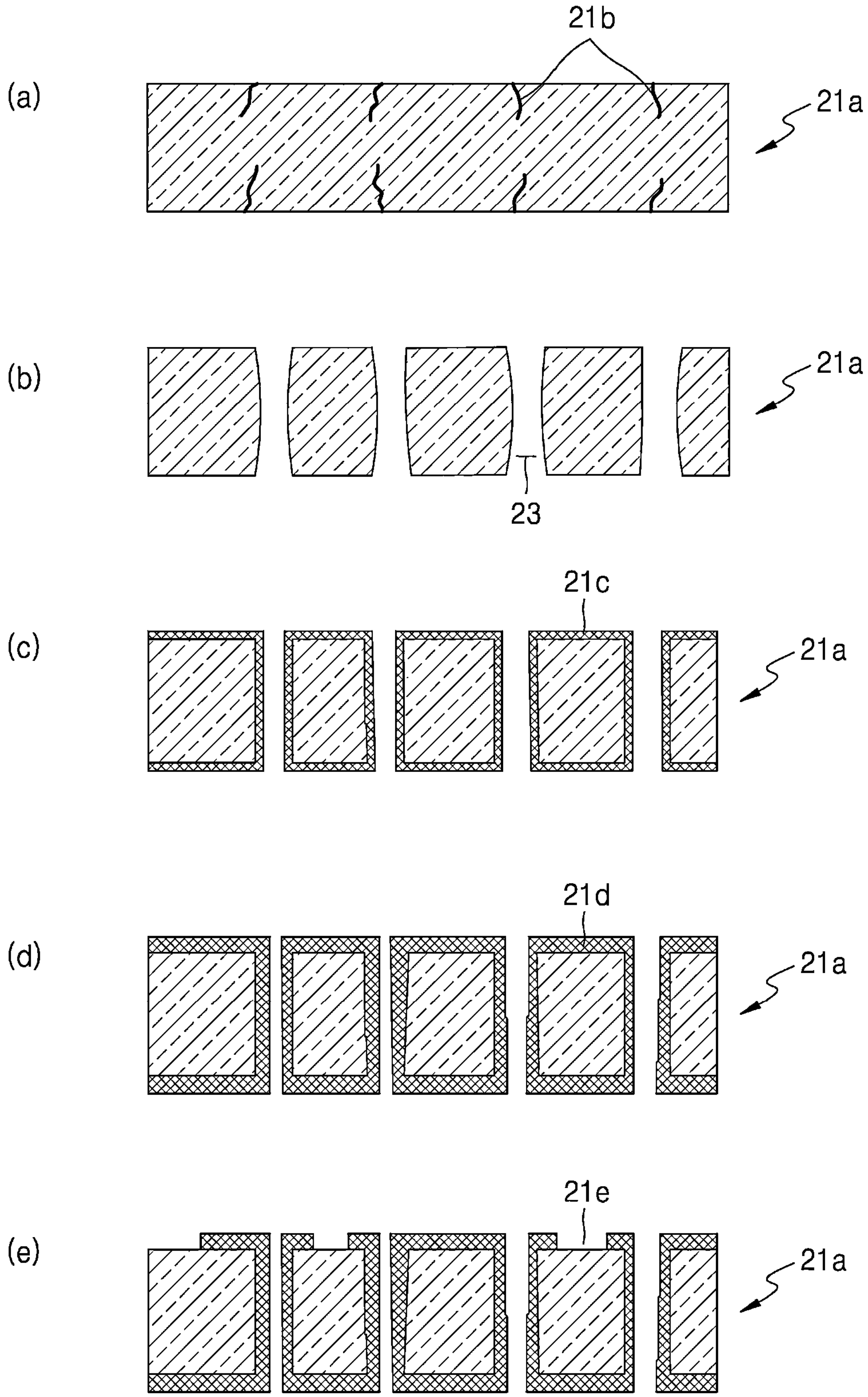
FIG. 4 is a flow chart for describing a process of generating a core distribution layer in a packaging substrate manufacturing process according to the embodiment in cross-sections.
Figure 5:
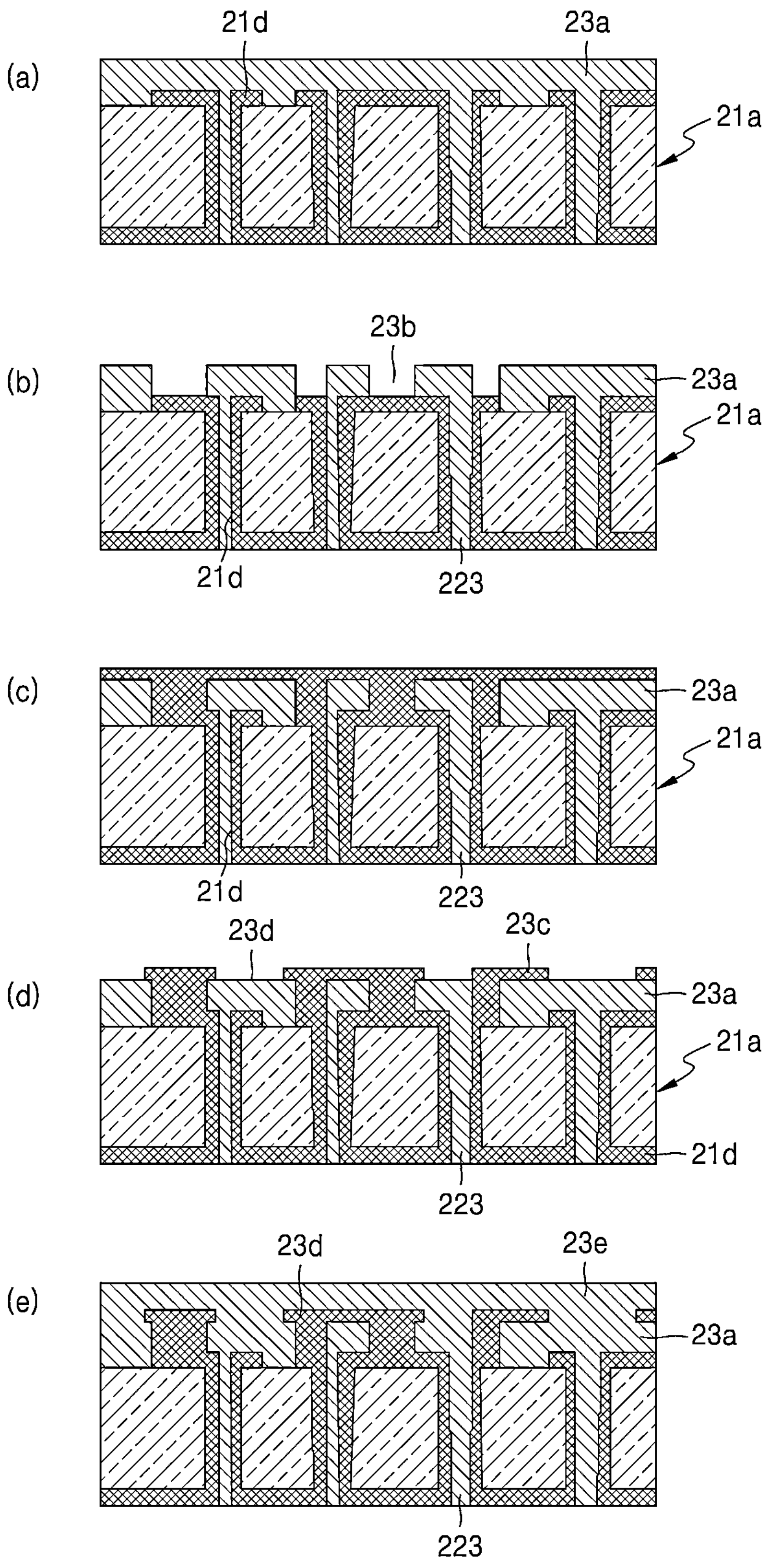
FIG. 5 is a flow chart for describing a process of generating an insulating layer of the packaging substrate manufacturing process according to the embodiment in cross-sections.

FIGS. 4 and 5 are flow charts for describing a manufacturing process of the packaging substrate according to the embodiment in cross-sections.

First, as shown in FIG. 4(*a*), a glass core 21*a* having flat first and second surfaces is prepared, and defects (flaw) 21*b* are formed at predetermined positions in a glass surface to form core vias. A glass core applied to a substrate of an electronic device or the like may be applied as the glass core, for example, an alkali-free glass core may be applied as the glass core, but the present disclosure is not limited thereto. As commercially available products, products manufactured by manufacturers such as Corning, Schott, AGC, and the like may be applied. A method such as mechanical etching, laser irradiation, or the like may be applied to the formation of the defects (grooves).

As shown in FIG. 4(*b*), in the glass core 21*a* having the defects (flaw) 21*b*, an etching operation of forming the core vias 23 through a physical or chemical etching process is performed. During the etching process, the vias are formed in defective portions of the glass core, and the surface of the glass core 21*a* may also be etched. In order to prevent etching of the glass surface, a masking film or the like may be applied, but considering the inconvenience of applying and removing the masking film, the defective glass core itself may be etched, and in this case, the thickness of the glass core having the core vias may be somewhat thinner than the initial thickness of the glass core.

Thereafter, as shown in FIGS. 4(*c*) and (*d*), a core layer manufacturing operation may be performed by forming an electrically conductive layer 21*d* on the glass core. A metal layer including copper metal may be representatively applied as the electrically conductive layer, but the present disclosure is not limited thereto.

Since the surface of the glass (including the surface of the glass core and a surface of the core via) and the surface of the copper metal have different properties, adhesion is low. In the embodiment, the adhesion between the glass surface and the metal may be improved by two methods such as a dry method and a wet method.

The dry method is a method of applying sputtering, that is, a method of forming a seed layer 21*c* on the glass surface and an inner diameter of the core via through metal sputtering. Dissimilar metals such as titanium, chromium, and nickel may be sputtered together with copper to form the seed layer, and in this case, glass-metal adhesion may be improved by an anchor effect, in which metal particles interact with the surface morphology of the glass, or the like.

The wet method is a method of performing primer treatment, and is a method of forming a primer layer 21*c* by performing pre-treatment with a compound having a functional group such as an amine. The primer treatment may be performed with a compound or particles having an amine functional group after performing pre-treatment with a silane coupling agent according to the degree of intended adhesion.

As mentioned above, a support substrate of the embodiment needs to have high enough performance to form a micro pattern, and this should be maintained even after primer treatment. Accordingly, when such a primer includes nanoparticles, nanoparticles having an average diameter of 150 nm or less may be applied, for example, nanoparticles having an amine group may be applied. The primer layer may be, for example, formed by applying a bonding strength improving agent manufactured by the CZ series or the like of MEC.

In the seed layer/primer layer 21*c*, the electrically conductive layer may selectively form the metal layer in a state in which unnecessary portions for the formation of the electrically conductive layer are removed or not removed. Further, in the seed layer/primer layer 21*c*, portions required or not required for the formation of the electrically conductive layer in an activated or deactivated state may be treated selectively with metal plating to perform subsequent processes. For example, light irradiation treatment, such as a laser of a certain wavelength or the like, chemical treatment, or the like may be applied to the activation or deactivation treatment. A copper plating method or the like applied to semiconductor element manufacturing may be applied to the formation of the metal layer, but the present disclosure is not limited thereto.

As shown in FIG. 4(*e*), a portion of the core distribution layer may be removed when unnecessary, and after a portion of the seed layer is removed or deactivated, metal plating may be performed to form an electrically conductive layer in a predetermined pattern, and then an etching layer 21*e* of the core distribution layer is formed.

FIG. 5 describes a manufacturing operation of forming an insulating layer and an upper distribution pattern according to one embodiment.

As shown in FIG. 5(*a*), the core via may go through an insulating layer forming operation of filling an empty space with an insulating layer after forming the core distribution layer, which is the electrically conductive layer. In this case, an insulating layer manufactured in the form of a film may be applied as the insulating layer to be applied, and for example, a pressure sensitive lamination method of the insulating layer in the form of a film, or the like may be applied. When the pressure sensitive lamination is performed in this way, the insulating layer is sufficiently incorporated into the empty space in the core via to form a core insulating layer in which a void is not formed.

FIG. 5(*b*) to (*e*) describe an upper layer manufacturing operation.

The upper layer manufacturing operation is an operation of forming an upper insulating layer and an upper distribution layer comprising an upper distribution pattern on the core layer. The upper insulating layer may be formed by a method of coating a resin composition forming an insulating layer 23*a* or laminating insulating films, and for convenience, the method of laminating the insulating films is preferable. The laminating of the insulating films may be performed by a process of laminating and curing insulating films, and in this case, when the pressure sensitive lamination method is applied, an insulating resin may be sufficiently incorporated even into a layer in which the electrically conductive layer is not formed in the core via or the like. An upper insulating layer which comes into direct contact with at least a portion of the glass core, and thus has sufficient adhesion is applied as the upper insulating layer. Specifically, the glass core and the upper insulating layer may have characteristics in which adhesion test values according to ASTM D3359 satisfy 4B or more.

The upper distribution pattern may be formed by repeating the process of forming the insulating layer 23*a*, and forming an electrically conductive layer 23*c* in a predetermined pattern and etching unnecessary portions to form an etching layer 23*d* of the electrically conductive layer, and electrically conductive layer formed adjacent to each other with the insulating layer therebetween may be formed by a method of performing a plating process after forming a blind via 23*b* in the insulating layer. A dry etching method such as laser etching, plasma etching, or the like, a wet etching method using a masking layer and an etchant, or the like may be applied to the formation of the blind via.

Hereinafter, although not shown in the drawings, an upper surface connection layer and a cover layer may be formed.

The upper surface connection pattern and the upper surface connection electrode may also be formed in a process similar to forming the upper distribution layer. Specifically, the upper surface connection pattern and the upper surface connection electrode may be formed by a method of forming an etching layer of the insulating layer on an insulating layer 23*e*, forming an electrically conductive layer thereon, and then forming an etching layer of the electrically conductive layer, or the like, but a method of selectively forming only the electrically conductive layer without applying an etching method may also be applied. The cover layer may be formed so that an opening (not shown) may be formed at a position corresponding to the upper surface connection electrode and thus the upper surface connection electrode is exposed, and the cover layer may be directly connected to an element connection portion, a terminal of an element, or the like.

When the upper layer is generated, a process for the lower layer may be performed by forming a lower connection layer and the cover layer. A lower distribution layer and/or the lower connection layer, and selectively, the cover layer (not shown) may be formed in a method similar to the above-described operation of forming the upper surface connection layer and cover layer.

Figure 6:
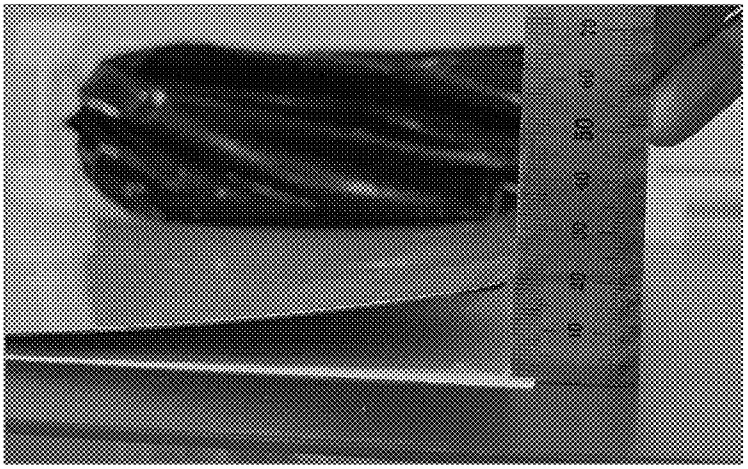
FIG. 6 is a view for describing a warpage phenomenon that occurs in a packaging substrate when an insulating layer is formed according to the related art.

FIG. 6 is a view for describing a warpage phenomenon that occurs in a glass core when an insulating layer is formed according to the related art.

As described above, the electronic element may be formed to be inserted into the insulating layer, and when the cavity portion, that is, a cavity region, is filled with a thick insulating film (for example, an Ajinomoto Build-up Film, ABF) at one time during the embedding process, as shown in FIG. 6, asymmetrical shrinkage may occur on one surface of the substrate after curing.

Curing the insulating layer may comprise a pre-curing (PRE-CURE) operation of pre-curing the insulating film without completely curing the insulating film, and a curing operation of completely curing the insulating film.

During the pre-curing, a large shrinkage force may be generated in a specific direction due to a chemical reaction between an insulating film such as the ABF and components in the insulating film, a deviation of the coefficient of thermal expansion (CTE) of the glass core, residual thermal stress, or the like, and warpage (a warpage phenomenon) occurs due to the stress generated at this time. As shown in FIG. 6, defects may occur in the form of being bent in a direction toward the insulating film and thus protruding toward the glass core. For example, after determining a position of the electronic element using an adhesive film in a through-type cavity, the insulating film is located on a surface opposite the adhesive film. Thereafter, pre-curing is performed with pressure sensitive lamination, and the adhesive film is removed for subsequent operations. In this case, a shrinkage force is generated in the insulating layer due to the residual stress in the insulating layer or the like, and this may cause warpage in a glass core.

In this case, a problem in that the element disposed in the cavity region is detached, moves, or separated from its original position may occur. In the case of pre-curing, since the insulating film is not completely cured, a force for fixing the element is weak, and separation of the element may occur relatively easily.

Further, the packaging substrate (or glass core) may be laid on a flat floor, and the warpage can be measured as an average of separation heights of edges of the packaging substrate (or glass core) from the floor on which the packaging substrate or glass core is laid. As shown in FIG. 6, there was a case in which one apex of the packaging substrate (or glass core) e was spaced apart from the floor by approximately 20 mm, that is, about 2 cm, due to shrinkage caused by pre-curing. This may act as a fatal defect in the production of the packaging substrate.

A packaging substrate according to an embodiment may have a height of 12 mm or less at which the corners are spaced apart. This is an excellent characteristic compared to the case where the existing example of FIG. 6 is spaced apart by about 2 cm.

The packaging substrate according to an embodiment is placed on a flat bottom, and the height at which the corners of the packaging substrate may be spaced apart from the bottom may be 10 mm or less, 8 mm or less, 6 mm or less, or 4 mm or less. The spaced height may be 0 mm or more or 1 mm or more. Such a packaging substrate has a relatively small degree of bending, enabling a stable packaging substrate manufacturing process and reducing a defect rate.

The height at which the corners are spaced apart is measured by placing the packaging substrate on a flat bottom and without applying a separate external force. For example, the highest value among the four corners of the rectangular packaging substrate is taken and presented as a height at which the corners are spaced apart. Accordingly, according to one embodiment of the present disclosure, it is proposed to perform a pre-curing process of the insulating film a plurality of times instead of once.

Figure 7:
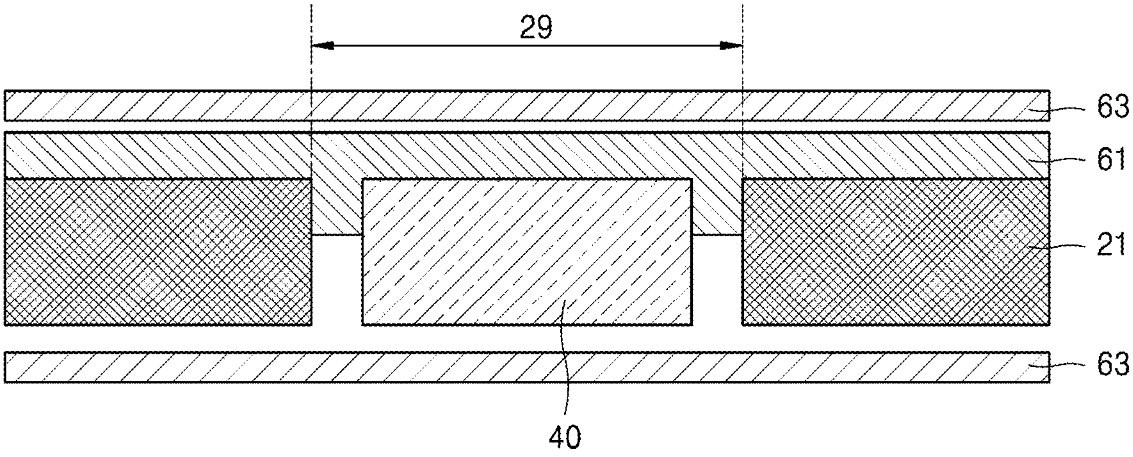
FIG. 7 is a cross-sectional view for describing the concept of the packaging substrate manufacturing method according to the embodiment.

FIG. 7 is a cross-section for describing a concept of the packaging substrate manufacturing method according to the embodiment.

The packaging substrate in FIG. 7 is a conceptually simplified for describing the formation of the insulating layer, and contents described with reference to FIGS. 1 to 3 may be applied.

A cavity portion 29 according to FIG. 7 is formed through both the first surface and the second surface of the glass core 21, and the electronic element 40 is disposed in the cavity portion 29. The cavity portion 29 may be formed simultaneously with the core via through the same forming operation as the core via, and may also be formed independently after or before the core via is formed. Unlike FIG. 7, the cavity portion 29 may be formed in the form of a recessed surface of which only one of the first surface and the second surface is open. The cavity portion 29 in this case may also be formed simultaneously with the core via through the same forming operation as the core via, and may be formed independently after or before the core via is formed. As described above, the electronic element 40 may comprise a passive element and/or an active element.

As shown in FIG. 7, in order to fill the core via and the cavity portion 29 of the glass core 21 constituting the core layer, an insulating film having a relatively thin thickness instead of a conventional thick insulating film may be used, and an insulating layer may be generated on at least one surface of the glass core through two or more operations. That is, the insulating film is laminated by dividing lamination into two or more times, and then pre-curing is performed after each lamination. Accordingly, warpage may be minimized and separation of the electronic element from the substrate may be prevented.

Looking at this in detail, in the direction from the first surface to the second surface, a first insulating film 61 may be laminated (including a case in which components of the insulating film are incorporated into a hole or the cavity space by applying pressure sensitive lamination) and cured, and accordingly a first insulating layer may be generated. Thereafter, a second insulating film 63 may be laminated on the first insulating layer to form a cured second insulating layer. Further, a third insulating layer in which the second insulating film 63 is laminated and cured in a direction from the second surface to the first surface simultaneously or in a separate process may be generated.

That is, the first insulating layer may be formed through laminating the first insulating film and a primary curing operation (pre-cure), and the second insulating layer may be formed through laminating the second insulating film on the glass core (on the first insulating layer) and a secondary curing operation (pre-cure). Further, in the secondary curing operation, the second insulating layer and the third insulating layer may be formed through laminating a second insulating film on the lower part of the glass core (second surface) as well as laminating on the upper part of the glass core (first insulating layer) and the secondary curing operation (pre-cure). In this case, since curing is simultaneously performed at both sides of the glass core, stress generation may be dispersed, and it may become relatively advantageous for substantially suppressing warpage.

Like the above, the warpage phenomenon may be improved or eliminated while stably forming the insulating layer in the core via and the cavity portion 29 through pre-curing treatment including two operations.

Figure 8:
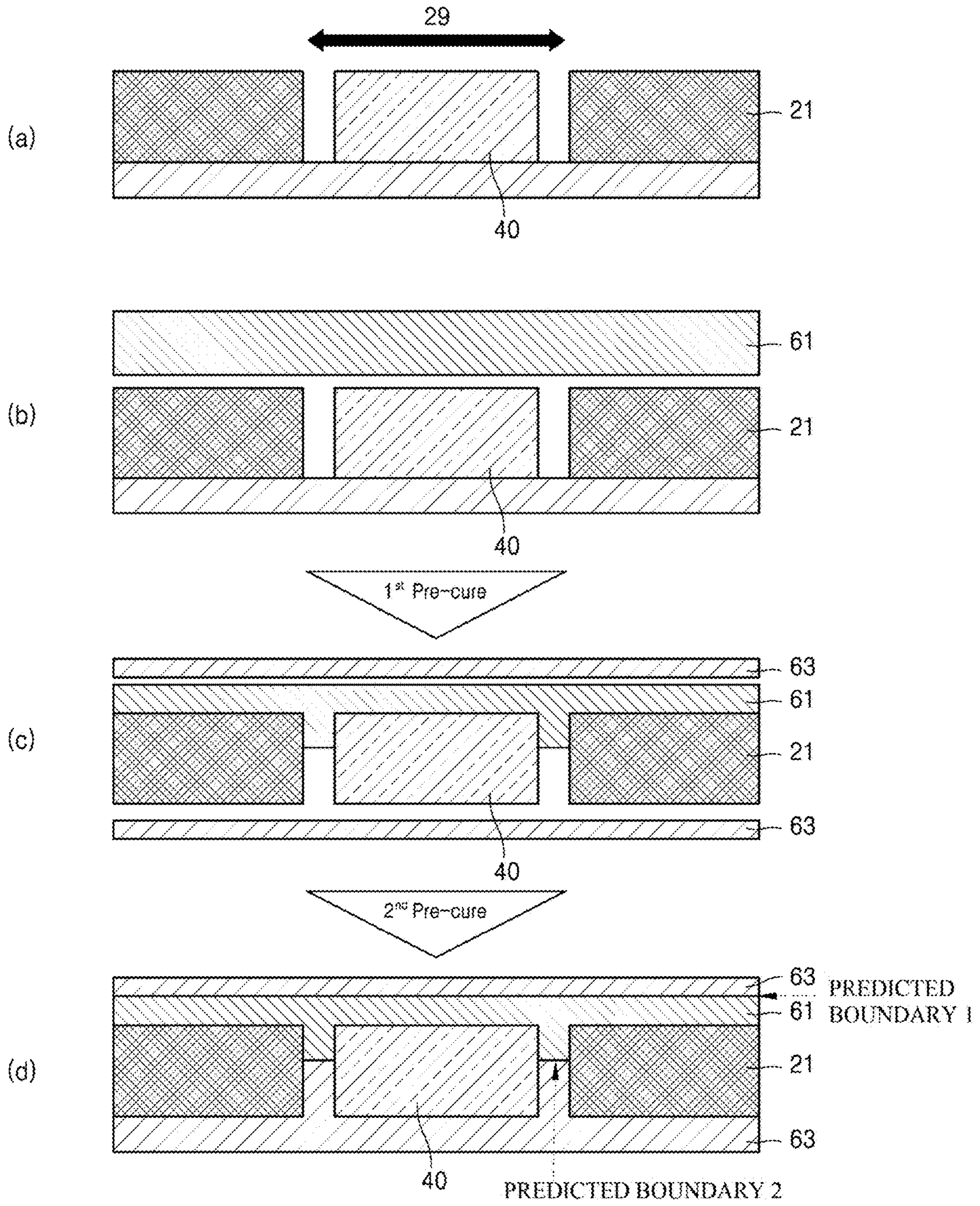
FIG. 8 is a flow chart for describing the packaging substrate manufacturing process according to the embodiment in cross-sections.

FIG. 8 is a flow chart for describing the packaging substrate manufacturing process according to the embodiment in cross-sections.

Looking at the operation of forming the insulating layer in the packaging substrate through FIG. 8 in more detail as follows.

First, as shown in FIG. 8(*a*), an adhesive film such as a polyimide tape (PI tape) is attached to the glass core 21, and the electronic element 40 is selected and disposed in the cavity portion 29 (designation of the position of the electronic element).

Thereafter, as shown in FIG. 8(*b*), a primary lamination process (first lamination on top) may be performed on the first surface. When the first insulating film 61 is laminated on the entire first surface of the glass core 21 and primary curing ($1^{st}$ Pre-cure) is performed, as shown in FIG. 8(*c*), an insulator of the first insulating layer may infiltrate into an inner space of the cavity portion 29.

The adhesive film may be removed during a later process as necessary. For example, the adhesive film may be an adhesive film whose adhesive force may be reduced by irradiation with ultraviolet light or the like. The adhesive force of the adhesive film may be reduced by irradiating the adhesive film with ultraviolet rays directly or through the glass core, and the adhesive film may be easily removed from the glass core. Further, the position of the electronic element 40 may be fixed by the first insulating layer pre-cured by the primary curing operation, and when the degree of warpage is controlled to a certain level or less, subsequent processes may be applied without fixing the adhesive film.

When the first insulating layer is generated, as shown in FIG. 8(*c*), after laminating the second insulating film 63 on each of the primarily cured first insulating film 61 and/or the second surface, a secondary curing operation of performing secondary curing ($2^{nd}$ pre-cure) may be performed ($2^{nd}$ Lamination on top & bottom).

When the secondary curing is also completed, as shown in FIG. 8(*d*), insulating layers divided by a boundary of the insulating films may be generated. In other words, the insulating layers may comprise a first insulating layer in which the first insulating film 61 is laminated in the direction from first surface to the second surface and cured, and a second insulating layer in which the second insulating film 63 is laminated on first insulating layer and cured. Optionally, the insulating layers may further comprise a third insulating layer in which the second insulating film 63 is laminated in the direction from the second surface to the first surface and cured. A predicted boundary 1 where the first insulating film 61 and the second insulating film 63 come into contact may be formed between the first insulating layer and the second insulating layer and a predicted boundary 2 where the first insulating film 61 and the second insulating film 63 come into contact may be formed between the second insulating layer and the third insulating layer.

According to an example, the thickness of the first insulating film 61 to which the primary curing is applied and the thickness of the second insulating film 63 to which the secondary curing is applied may be different from each other.

The first insulating film 61 and the second insulating film 63 may be applied with a thickness ratio of 1:0.5 to 2, or 1:0.6 to 1.5. For example, when the total thickness of the first insulating film 61 and the second insulating film 63 is 80 μm, the thickness ratio of the first insulating film 61 to the second insulating film 63 may be in a range of 30/50, 50/30, or 40/40. And when the total thickness of the first insulating film 61 and the second insulating film 63 is 60 μm, the thickness ratio of the first insulating film 61 to the second insulating film 63 may be in a range of 30/30, 20/40, or 40/20. Alternatively, when the total thickness of the first insulating film 61 and the second insulating film 63 is 30 μm, the thickness ratio of the first insulating film 61 to the second insulating film 63 may be in a range of 15/15, 10/20, or 20/10.

Of course, the pre-curing operation may be performed more than twice. The thickness and number of curing times of the insulating film may be optimally set according to the size of the cavity portion 29 and the height of the glass core 21.

An insulating film such as an ABF may be cured by applying heat.

Specifically, the insulating film may be pre-cured using a thermal curing method after inducing some components of the insulating film to be disposed in the via, the cavity, and the like by a pressure sensitive lamination method. In this case, the pre-curing means that the insulating film is not completely cured, but is cured to an intermediate level, and the curing may be controlled by adjusting a curing temperature or the like.

The temperature and pressure are not the same during the primary and secondary curing. The pressure and temperature applied during the secondary curing operation are higher than the pressure and temperature applied during the primary curing operation.

The primary curing operation may be performed at a primary curing temperature of 60° C. to 145° C.

The primary curing temperature may be 60° C. or more or 65° C. or more. The primary curing temperature may be 145° C. or less, 140° C. or less, 130° C. or less, 120° C. or less, 110° C. or less, 100° C. or less, or 90° C. or less. In this case, the insulating layer may not be completely cured, and curing may proceed to a level of the pre-curing.

The primary curing operation may be performed under a reduced pressure condition of 15 kgf/cm$^2$ or less, 12 kgf/cm$^2$ or less, or 10 kgf/cm$^2$ or less. Further, the reduced pressure condition may be 2 kgf/cm$^2$ or more, or 5 kgf/cm$^2$ or more. The secondary curing operation may be performed at a secondary curing temperature of 120° C. to 180° C.

The secondary curing temperature may be 120° C. or more, 130° C. or more, 140° C. or more, 150° C. or more, or 160° C. or more. The secondary curing temperature may be 180° C. or less, 170° C. or less, or 165° C. or less. In this case, the insulating layer may not be completely cured, and curing may proceed to a level of the pre-curing.

The secondary curing operation may be performed under a reduced pressure condition of 22 kgf/cm$^2$ or less, 20 kgf/cm$^2$ or less, or 18 kgf/cm$^2$ or less. Further, the reduced pressure condition may be 10 kgf/cm$^2$ or more, or 13 kgf/cm$^2$ or more.

The curing temperature of the primary curing operation may be applied at a higher temperature than the curing temperature of the secondary curing operation.

The temperature increase to the primary curing temperature may be performed for 20 minutes to 120 minutes, and may also be performed for 20 minutes to 80 minutes. The primary curing temperature may be maintained for 20 minutes to 120 minutes, and may also be maintained for 20 minutes to 80 minutes.

The temperature increase to the secondary curing temperature may be performed for 20 minutes to 100 minutes, and may also be performed for 20 minutes to 80 minutes. The secondary curing temperature may be maintained for 20 minutes to 100 minutes, and may also be maintained for 20 minutes to 80 minutes.

When the curing is performed under the above temperature and pressure conditions, an insulating layer, which is pre-cured or cured to an intended level, may be acquired.

When such a pre-curing operation such as the primary curing and/or the secondary curing is performed, a final curing operation of completely curing the insulating film may be additionally performed. And an operation of flattening the surface of the substrate may be performed between the pre-cure and the curing process. That is, it is possible to induce the upper surface of the insulating layer to be flattened. For example, a method of positioning a planarization film (e.g., a PET film) on an insulating layer may be applied to a pressure-reducing lamination process. However, the flattening method is not limited to this.

According to an example, such planarization may be performed between the above-described primary curing and secondary curing.

Meanwhile, it will be apparent to those skilled in the art that the pre-curing operation of the insulating film described with reference to FIG. 8 may also be applied to the cavity portion open in one direction toward the first surface or the second surface of the glass core 21.

Figure 9A:
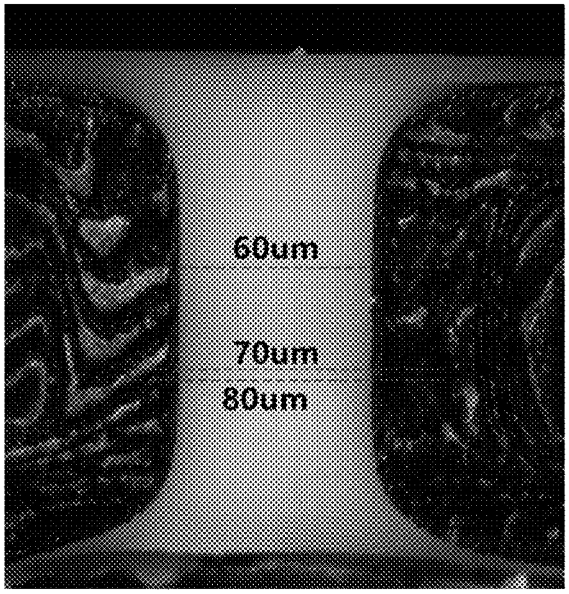
FIGS. 9A and 9B are micrographs of boundaries of insulating layers generated according to manufacturing of the packaging substrate according to the embodiment, respectively.
Figure 9B:
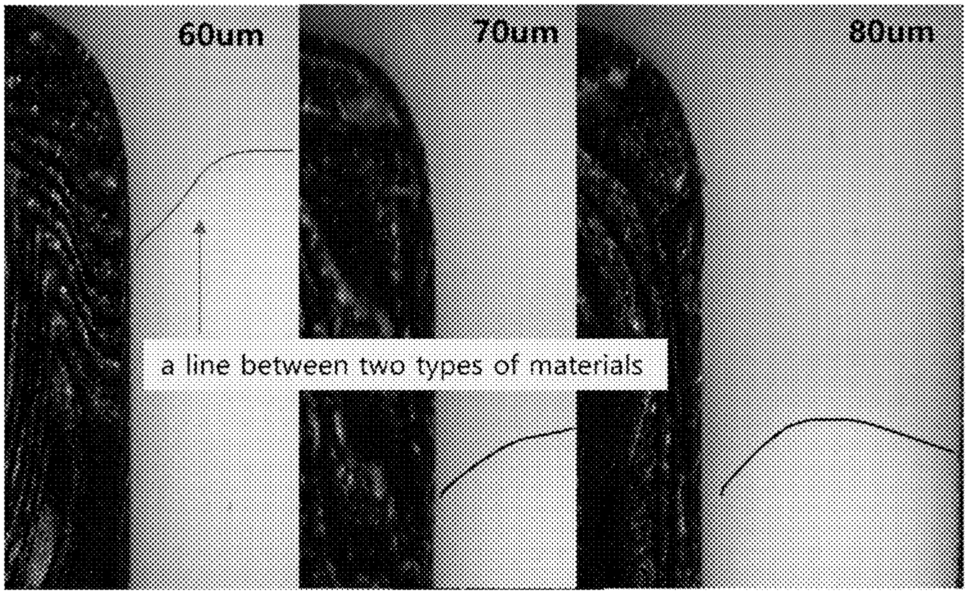

FIGS. 9A and 9B are micrographs of boundaries of insulating layers generated according to manufacturing of the packaging substrate according to the embodiment, respectively.

An insulating layer as shown in FIG. 9A or 9B is formed through the processes in FIG. 8. That is, a first boundary where the first insulating film 61 and the second insulating film 63 come into contact is formed between the first insulating layer and the second insulating layer, and a second first boundary where the first insulating film 61 and the second insulating film 63 come into contact is formed between the second insulating layer and the third insulating layer.

'A line between two type of materials' in FIG. 9B indicates the second boundary formed between the second insulating layer and the third insulating layer in the cavity portion 29. This boundary indicates that the insulating layer is generated through a plurality of curing operations rather than one curing operation, and since the temperature and pressure applied during curing are different, the boundary may be observed.

For example, the boundary of the color difference may be observed as a line.

For example, the boundary may be observed in the form of a band (e.g., a color change such as gradient) in which a color with a relatively constant thickness change. For example, the regular interval may be 2 to 30 μm, and may be 3 to 10 μm.

Further, colors of the insulating layers divided by the boundary, for example, the first insulating layer and the third insulating layer may be different from each other.

As shown in FIGS. 9A and 9B, the thickness of the first insulating film 61 may be 60 μm, 70 μm, or 80 μm, and a position where the second boundary is formed may be changed according to the thickness of the first insulating film 61.

Figure 10:
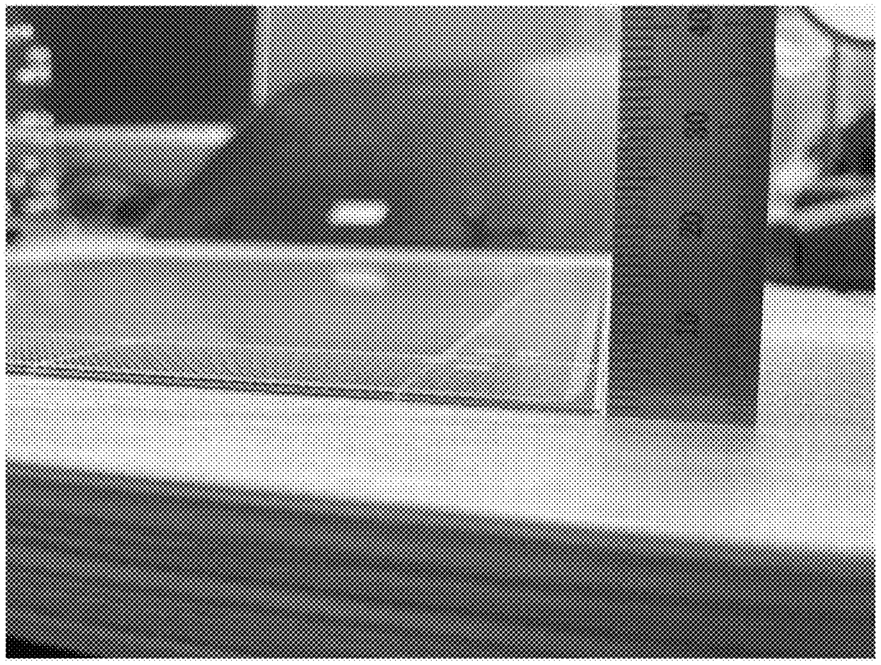
FIG. 10 is a photograph for describing the warpage of the packaging substrate generated according to the manufacturing of the packaging substrate according to the embodiment.

FIG. 10 is a photograph for describing the warpage of the packaging substrate generated according to the manufacturing of the packaging substrate according to the embodiment.

As described above, warpage may be measured as an average of separation heights of edges of the glass core from the floor on which the packaging substrate or glass core are laid, and FIG. 10 illustrates warpage in the case in which the curing process for the insulating film is performed by a plurality of divided operations according to the embodiment of the present disclosure.

The glass core may have a quadrangular shape (according to one embodiment, a lateral length and a longitudinal length of the glass core are approximately 53 cm), and a thickness thereof may be 400 μm to 600 μm according to one embodiment. When the curing process for the insulating film is performed on the glass core by a plurality of divided operations, as shown in FIG. 10, one vertex of the glass core is spaced apart from the floor by a distance less than 0.1 mm.

It may be evaluated that such warpage is significantly improved, and the warpage is almost eliminated compared to FIG. 6.

Figure 11:
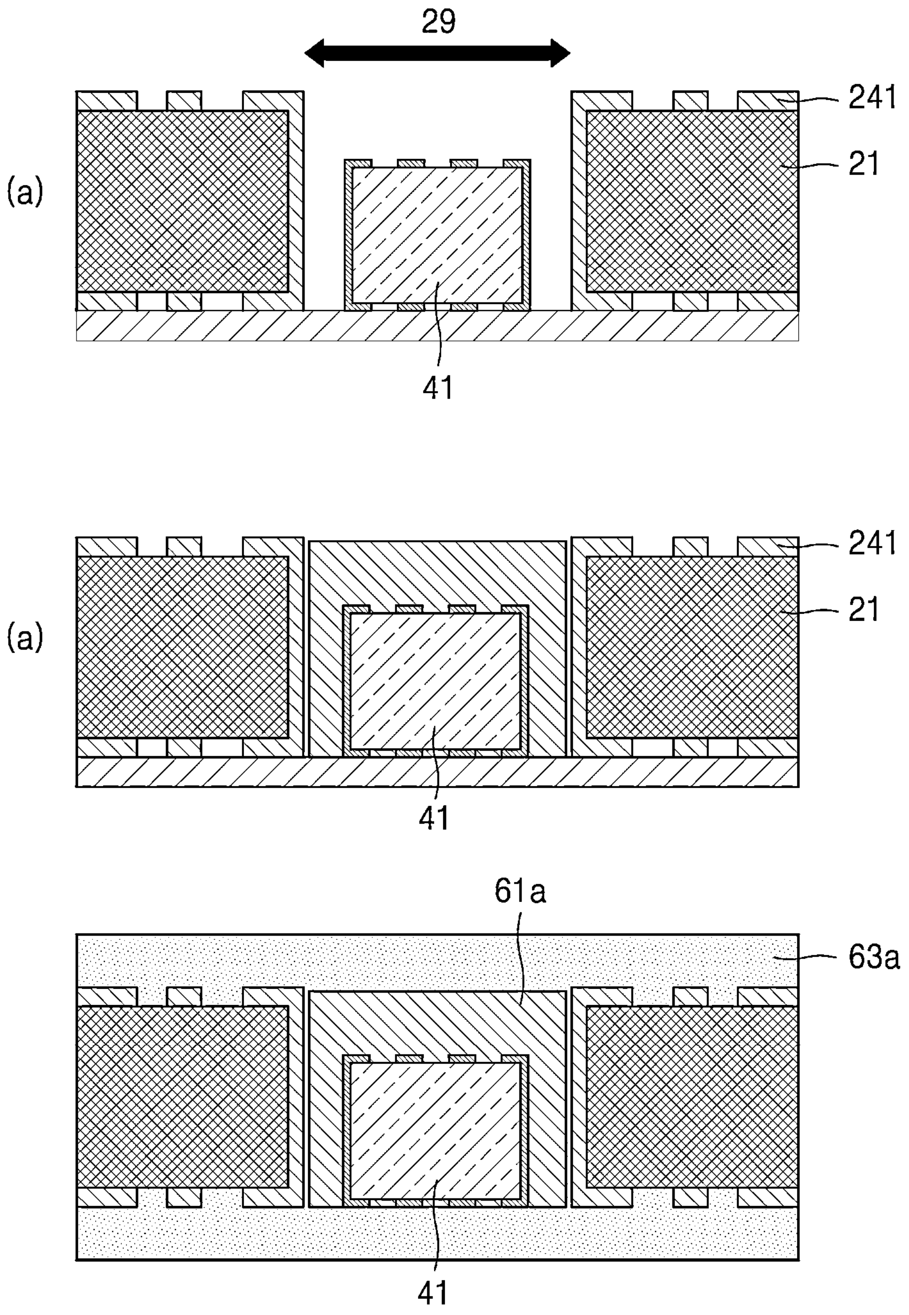
FIG. 11 is a flow chart for describing a packaging substrate manufacturing process according to another embodiment.

FIG. 11 is a flow chart for describing a packaging substrate manufacturing process according to another embodiment.

As shown in the drawing, a cavity portion 29 in FIG. 11 also has a structure passing through the first surface and the second surface of the glass core 21, and for example, a multilayer ceramic capacitor (MLCC) 41 is disposed as an electronic element.

As described above, in addition to a passive element such as the MLCC 41, an active element may also be disposed in the cavity portion 29 as an electronic element.

As shown in FIG. 11(*a*), an adhesive film such as a polyimide tape (PI tape) is attached to the glass core 21, and an electronic element such as MLCC 41 is disposed in the cavity portion 29.

According to the embodiment, a first insulating film is laminated and cured on the cavity portion 29 where the MLCC 41 is disposed or a region including the cavity portion 29 rather than the entire first surface. That is, according to FIG. 11, a first insulating layer 61*a* formed in the packaging substrate is not formed on the entire upper surface of the glass core 21, but is formed in the form of filling all or part of the empty area of the core via and/or the cavity portion 29. In this case, the first insulating layer 61*a* may serve as an insulating layer surrounding an electronic element such as the MLCC 41.

In this case, the first insulating film may be cut based on the shape and size of the cavity portion 29 and laminated on the cavity portion 29. For example, the shape of the cut first insulating film may be generally the same as or similar to the shape of the cavity portion 29 when viewed from above.

The size (width) of the first insulating film may be adjusted to be greater or smaller in consideration of a volume of the insulating layer to be incorporated into the cavity portion 29, a thickness of the insulating layer, and the like. For example, a size (width) slightly greater than a shape of an opening of the cavity portion 29 and a thickness thinner than a thickness of the cavity portion 29 may be applied.

Accordingly, a sufficient amount of insulating material may be incorporated into the cavity portion while minimizing the formation of unnecessary insulating parts in a region other than the cavity portion 29. In addition, a substantially flat insulating layer surface can be obtained by minimizing the occurrence of surface undulation between electronic devices and/or between electronic devices and cavity.

As described above, the forming of the insulating layer may be performed a different number of times according to the thickness of the glass core 21, the thickness of the insulating film, or the size and properties of the electronic element. In addition, the region of the insulating layer to be subjected to primary curing may also be transformed into various structures according to arrangement of the cavity portion 29 and the size and properties of the electronic element.

When the first insulating layer 61*a* is formed, as shown in FIG. 8(*c*), a second insulating film may be laminated on the entire first surface and second surface of the glass core 21, and secondary curing may be performed.

After the secondary curing, as shown in FIG. 11(*c*), a second insulating layer 63*a* surrounding both the glass core 21 and the first insulating layer 61*a* may be formed.

Figure 12:
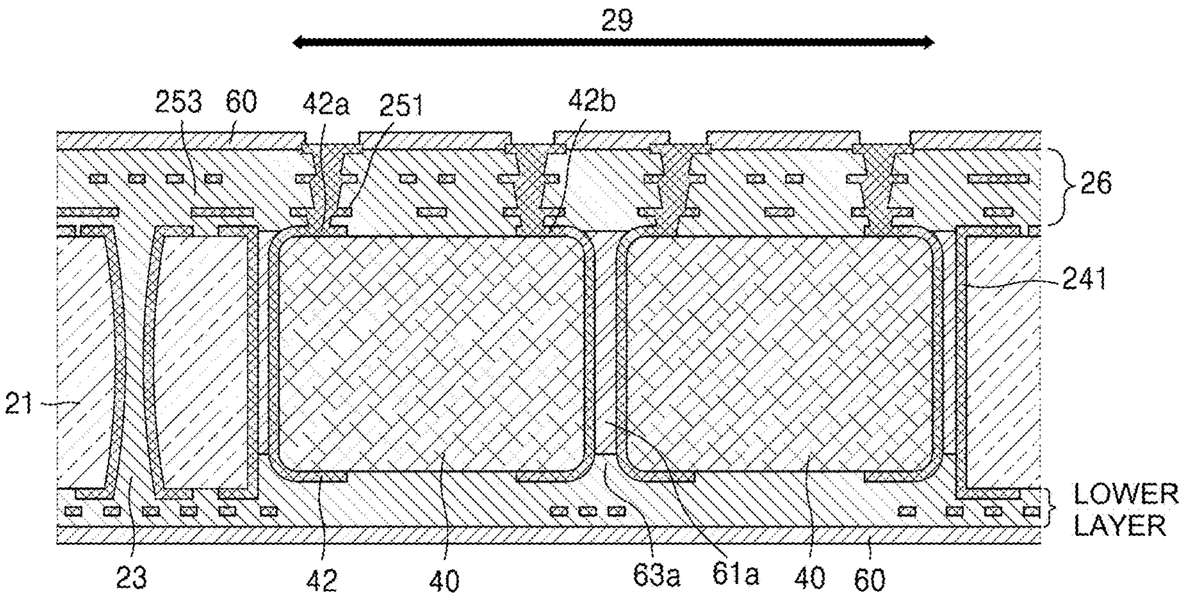
FIG. 12 is a conceptual diagram for describing a structure of the packaging substrate according to another embodiment in cross-section.

FIG. 12 is a conceptual diagram for describing a structure of the packaging substrate according to another embodiment in cross-section.

As shown in the drawing, the packaging substrate may have a glass structure having a structure of core vias 23, a cavity portion 29, and an electronic element 40 disposed in the cavity portion 29 on a glass core 21, that is, the packaging substrate may comprise a core layer, an upper layer 26 located on the core layer, and a lower layer located under the core layer. A cover layer 60 is formed on the upper layer 26 and the lower layer. The number of electronic elements 40 is not specified, and two are shown in the embodiment.

A core distribution pattern 241, which is an electrically conductive layer electrically connecting a first surface and a second surface of the glass core 21, is formed on surfaces of the core via 23 and the cavity portion 29. Further, an element electrically conductive layer 42 for electrically connecting the electronic element 40 and an upper distribution pattern 251 of the upper layer 26 is formed on portions of an upper surface, a side surface, and a lower surface of the electronic element 40.

Meanwhile, as shown in the drawing, the first insulating layer 61*a* fills a space between two electronic elements 40 and an inner space of the cavity portion. The packaging substrate according to FIG. 12 is formed only in a limited region capable of covering the cavity portion rather than the entire first surface of the glass core 21 like the first insulating layer described with reference to FIG. 11. Further, the first insulating layer 61*a* is not laminated on the upper surface of the cavity portion 29, and may fill an empty space in a side surface of the cavity portion 29, that is, in the region where the electronic element 40 is arranged.

According to one embodiment, the electronic element 40 may be an MLCC, and when the MLCC is disposed in the cavity portion 29 passing through the glass core 21, one surface of an upper surface and a lower surface instead of both side surfaces of the MLCC may be connected to the upper distribution pattern 251. That is, as shown in FIG. 12, two electrodes 42*a* and 42*b* of the MLCC are electrically connected to the upper distribution pattern 251 formed in the upper layer 26, and current flows into the first electrode 42*a* and flows out through the second electrode 42*b*. The electrodes 42*a* and 42*b* may be formed as portions of the element electrically conductive layer 42, and may also be formed in stages through a separate laminating process.

Of course, the two electrodes 42*a* and 42*b* of the MLCC may be formed in the direction of the second surface, which is the lower surface of the glass core 21, rather than the first surface which is the upper surface.

After the element electrically conductive layer 42 is formed on the electronic element 40 and the first insulating layer 61*a* surrounding the element electrically conductive layer 42 is formed, the second insulating layer 63*a* may be formed on and below the first insulating layer 61*a* and the glass core 21. That is, in order to fill the cavity portion 29 and not use a conventional method of filling the cavity region once, an insulating film having a relatively thin thickness instead of a conventional thick insulating film may be used, and the insulating layer may be generated on at least one surface of the glass core through two or more operations. That is, the insulating film is laminated by dividing the lamination into two or more times, and then pre-curing is performed after the lamination. Accordingly, warpage may be minimized and separation of the electronic element from the substrate may be prevented.

The upper layer 26 is formed on the second insulating layer 63*a* formed on the first surface. The upper layer 26 may comprise an upper insulating layer 253, and an upper distribution pattern 251 embedded in the upper insulating layer 253 as an electrically conductive layer having a predetermined pattern and a portion electrically connected to the core distribution pattern 241 and the two electrodes 42*a* and 42*b* of the element electrically conductive layer 42.

The same insulating material may be applied to the second insulating layer 63*a* and the upper insulating layer 253, and in this case, a boundary thereof may be substantially hard to distinguish substantially at its cross-section. Alternatively, according to another embodiment, the boundary of the insulator layer generated by setting the pressure and temperature for curing the multi-layer insulator layers differently and thus the boundary may be substantially easy to distinguish.

Different insulating materials may be applied to the second insulating layer 63*a* and the upper insulating layer 253, and in this case, boundaries thereof may be more easily distinguished.

Further, as described above, the upper distribution pattern 251 refers to an electrically conductive layer located in the upper insulating layer 253 in a preset form, and may be formed, for example, by a build-up layer method. The method of manufacturing a packaging substrate and the packaging substrate manufactured thereby according to the above-described embodiments may improve a warpage phenomenon due to a difference in degree of thermal expansion of the substrate elements, and may prevent the separation or detachment of the electronic elements.

In a method of manufacturing a packaging substrate of an embodiment and a packaging substrate manufactured thereby, a warpage phenomenon sharply decreases and thus the yield and quality of the packaging substrate can be improved.

Further, as a warpage phenomenon is improved, the separation or detachment of electronic elements disposed in a cavity portion of a glass core can be prevented.

The present disclosure described above has been described with reference to the embodiments shown in the drawings, but this is merely exemplary, and those skilled in the art will understand that various modifications and variations of the embodiments are possible. That is, the scope of the present disclosure is not limited to the above-described embodiments, and various modifications and improved forms by those skilled in the art using the basic concepts of the embodiments defined in the following claims also belong to the scope of the embodiments. Accordingly, the true technical scope of the present disclosure should be defined by the technical spirit of the appended claims.

What is claimed is:

1. A method of manufacturing a packaging substrate, comprising:

generating a glass structure that is a core via, a cavity portion, or both on a glass core including a first surface and a second surface facing each other;

forming an insulating layer on the first surface or the second surface using an insulating film; and forming an upper layer including an upper distribution layer and an upper surface connection layer on the insulating layer, wherein the forming of the insulating layer comprises a primary curing operation of laminating a first insulating film on the first surface and primarily curing the first insulating film, and a secondary curing operation of laminating a second insulating film on the primarily cured first insulating film and secondarily curing the second insulating film, wherein the method further comprising performing a final curing operation of finally curing the first insulating film and the second insulating film after the second curing operation to control warpage of the glass core caused by thermal expansion difference.

2. The method of claim 1, wherein:

the cavity portion is open and recessed in a direction toward the first surface or the second surface of the glass core or passes through the first surface and the second surface to have a space where an electronic element is disposed;

the method further includes arranging the electronic element in the cavity portion;

the arranging of the electronic element is included between the generating of the glass structure and the forming of the insulating layer; and the first insulating film is laminated on the entire first surface or the cavity portion where the electronic element is arranged.

3. The method of claim 2, wherein when the first insulating film is laminated on the cavity portion, the first insulating film is cut based on a shape and a size of the cavity portion.

4. The method of claim 1, wherein a thickness of the first insulating film and a thickness of the second insulating film are different from each other.

5. The method of claim 1, wherein:

a pressure sensitive lamination method is applied to each of the primary curing operation and the secondary curing operation; and a pressure and a temperature applied during the secondary curing operation are higher than a pressure and a temperature applied during the primary curing operation.

6. The method of claim 1, further comprising:

after the secondary curing operation and before the final curing operation, adjusting a position of the electronic element or a planarization operation.

7. The method of claim 1, wherein the electronic element includes a passive element or an active element.

8. A packaging substrate comprising a core layer and an upper layer located on the core layer, wherein the core layer includes a glass core including a first surface and a second surface facing each other, a plurality of core vias and a cavity portion passing through the glass core in a thickness direction, an electrically conductive layer formed on a surface of the glass core, an electronic element arranged in the cavity portion, and an insulating layer filling the core vias and the cavity portion, the cavity portion is open and recessed in a direction toward the first surface or the second surface of the glass core or passes through the first surface and the second surface to have a space where the electronic element is disposed, and the insulating layer includes a first insulating layer in which a first insulating film is laminated on the first surface and cured, a second insulating layer in which a second insulating film is laminated on the first insulating layer and cured, and a third insulating layer in which the second insulating film is laminated in a direction from the second surface to the first surface and cured, wherein a first boundary where the first insulating film and the second insulating film come into contact is formed between the first insulating layer and the second insulating layer, and a second boundary where the first insulating film and the second insulating film come into contact is formed between the second insulating layer and the third insulating layer, and the second boundary is formed in the core vias and the cavity portion.

9. The packaging substrate of claim 8, wherein the first insulating layer is formed on the entire first surface or the cavity portion where the electronic element is arranged.

10. The packaging substrate of claim 8, wherein a color of the first insulating layer and a color of the third insulating layer are different from each other.

11. The packaging substrate of claim 8, wherein a thickness of the first insulating film and a thickness of the second insulating film are different from each other.

12. The packaging substrate of claim 8, wherein:

the glass core has a quadrangular shape and has a thickness of 300 μm to 1500 μm; and an average of heights in which edges of the packaging substrate is spaced apart from a floor on which the packaging substrate is laid is 12 mm or less.

13. The packaging substrate of claim 8, wherein the electronic element includes a passive element or an active element.

* * * * *